(12) United States Patent
Koli

(10) Patent No.: US 7,663,522 B2
(45) Date of Patent: Feb. 16, 2010

(54) PERFORMANCE OF A/D CONVERTER AND RECEIVER

(75) Inventor: Kimmo Koli, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/073,325

(22) Filed: Mar. 4, 2008

(65) Prior Publication Data

US 2008/0278360 A1  Nov. 13, 2008

(30) Foreign Application Priority Data

Apr. 30, 2007  (FI) .................................. 20075299

(51) Int. Cl.
*H03M 3/00* (2006.01)
(52) U.S. Cl. .................. 341/143; 341/144; 341/155
(58) Field of Classification Search ............... 341/143, 341/155, 117–120, 144
See application file for complete search history.

(56) References Cited

U.S. PATENT DOCUMENTS

| | | | | |
|---|---|---|---|---|
| 6,141,390 A | * | 10/2000 | Cova | ........................... 375/297 |
| 6,326,911 B1 | * | 12/2001 | Gomez et al. | ............... 341/143 |
| 6,549,067 B1 | * | 4/2003 | Kenington | .................... 330/52 |
| 6,798,844 B2 | * | 9/2004 | Ratto | .......................... 375/296 |
| 6,963,297 B2 | * | 11/2005 | Robinson et al. | ............. 341/143 |
| 6,973,138 B1 | * | 12/2005 | Wright | ........................ 375/297 |

FOREIGN PATENT DOCUMENTS

| | | |
|---|---|---|
| EP | 1 418 674 A1 | 5/2004 |
| WO | WO 03/030369 A2 | 4/2003 |

OTHER PUBLICATIONS

Philips, K. et al., "A Continuous-Time Sigma-Delta ADC with Increased Immunity to Interferers", IEEE Journal of Solid-State Circuits, vol. 39 No. 12, pp. 2170-2178, Dec. 2004.
Van Veldhoven, R., "A Triple-Mode Continuous-Time Sigma-Delta Modulator with Switched-Capacitor Feedback DAC for a GSM-Edge/CDMA2000/UMTS Receiver", vol. 38 No. 12, pp. 2069-2076, Dec. 2003.
International Search Report PCT/FI2008/050234 filed Apr. 29, 2008.

* cited by examiner

*Primary Examiner*—Jean B Jeanglaude
(74) *Attorney, Agent, or Firm*—Squire, Sanders & Dempsey, L.L.P.

(57) ABSTRACT

A delta-sigma A/D converter includes a D/A converter realized with a mixed-mode comb filter connected in a feedback loop from the output of the A/D converter to the input of the A/D converter. The D/A converter is configured to predistort a feedback signal. The converter further includes an analogue filter at the input of the A/D converter. The analogue filter is configured to cancel the predistortion of the feedback signal.

17 Claims, 8 Drawing Sheets

US 7,663,522 B2

PERFORMANCE OF A/D CONVERTER AND RECEIVER

FIELD

The invention relates to A/D converters realized using delta sigma modulators and receivers and apparatuses utilizing such A/D converters.

BACKGROUND

In general, radio transceivers operate in environments where interference is present. In addition to desired signals, noise and unwanted signal sources cause interference. For example, a radio transceiver may receive strong unwanted signals out of the desired signal range. These so called blocker signals must be filtered out from the received signal early in the receiver path of the transceiver. Preferably, the blocker signals should be filtered out from the received signal before analogue-to-digital conversion in order to prevent intermodulation distortion and aliasing.

Continuous-time delta-sigma or ΔΣ modulators may be used as the A/D converter of a receiver. The use of ΔΣ modulators relax the antialias filtering requirement but even with these modulators strong out-of-band signals may render the modulator unstable or at least create distortion.

Document K. Phillips et al, "A continuous-time ΔΣ modulator with increased immunity to interferers", IEEE J. of Solid-State Circuits, vol. 39, December 2004, discloses a known counter-measure against blocker signals. In the solution, the feedback signal of the ΔΣ modulator is predistorted with an analogue filter. This method is illustrated in FIG. 1. The ΔΣ-modulator comprises a forward path 100, a comparator 102, and a feedback loop 104 comprising a D/A converter 106 and an analogue high pass filter 108. Unfortunately, this method does not decrease the circuit complexity, since in order to save one filter stage in a prefilter before an A/D converter, two filter stages have to be added to the A/D converter. Additionally, the high pass filtering of the D/A converter output easily requires operational amplifiers with higher slew rate than other operational amplifiers in the modulator, thus further increasing the power consumption.

BRIEF DESCRIPTION OF THE INVENTION

An object of the invention is to provide an improved A/D converter. According to an aspect of the invention, there is provided a delta-sigma A/D converter, comprising: a D/A converter realized with a mixed-mode comb filter connected in a feedback loop from the output of the A/D converter to the input of the A/D converter, the D/A converter being configured to predistort a feedback signal, and an analogue filter at the input of the A/D converter, the analogue filter being configured to cancel the predistortion of the feedback signal.

According to another aspect of the invention, there is provided a method for improving the performance of a delta-sigma A/D converter, comprising: predistorting the signal of the feedback loop of the delta-sigma A/D converter with a D/A converter realized with a mixed-mode comb filter, and canceling the predistortion and filtering the input signal of the A/D converter with an analogue filter at the input of the A/D converter.

According to another aspect of the invention, there is provided an apparatus, having an analog signal as an input and one or more digital 1-bit or multibit signals as an output, comprising a first circuitry and a second circuitry connected in series; the first circuitry comprising a transconductance amplifier, and a switching arrangement and an impedance circuit connected in series, the input to the first circuitry being the analog signal; the second circuitry comprising a transconductance amplifier, and a switching arrangement connected in series, the input to the second circuitry being the output signal of the transconductance amplifier of the first circuitry; two delta-sigma A/D converters having at least two integrator stages, connected to the switching arrangement of the second circuitry; and two feedback mixed-mode D/A converters, whose inputs are connected to the output of the delta-sigma A/D converters and output between the switching arrangement and the impedance circuit of the first circuitry; the switching arrangement of the first circuitry being configured to switch the impedance of the impedance circuit of the first circuitry from base band to the local oscillator frequency, the second circuitry being configured to perform quadrature down-mixing from the local oscillator frequency to base band, and the switching arrangement and the impedance circuit of the first circuitry being configured to up-convert the signal from the two feedback mixed-mode D/A converters to the local oscillator frequency.

The invention provides several advantages. For example, the base band implementation of the proposed delta sigma modulator can be utilized to enhance existing radio receiver implementations using multibit continuous-time delta sigma modulators by relaxing operational amplifier specifications and improving sensitivity to clock jitter while relaxing channel filtering requirements. It may be even possible to omit multibit feedback and dynamic element matching logic by utilizing inherently linear 1-bit or 1.5-bit A/D and D/A converters.

LIST OF DRAWINGS

In the following, the invention will be described in greater detail with reference to the embodiments and the accompanying drawings, in which FIG. 1 illustrates an example of a prior art A/D converter realized with a delta sigma modulator;

DESCRIPTION OF EMBODIMENTS

Figure 1:
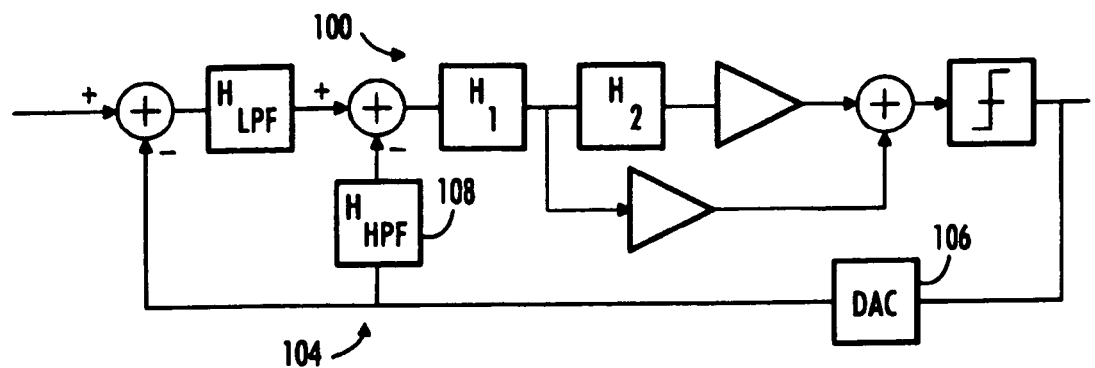
Figure 2A:
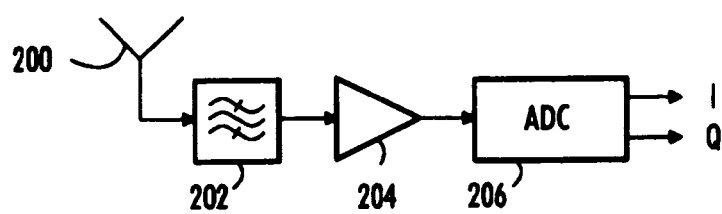
FIGS. 2A, 2B and 2C illustrate examples of a receiver to which embodiments of the invention may be applied.

With reference to FIG. 2A, examine an example of a receiver to which embodiments of the invention can be applied. The receiver of FIG. 2A comprises an antenna 200 receiving a signal. The antenna 200 is connected to a filter 202 configured to filter undesired frequencies from the received signal. The filtered signal is taken to a low noise amplifier 204 configured to amplify the signal. The amplified signal is taken to a sigma delta modulator 206 configured to convert the amplified analog signal to a digital form. At the output of the sigma delta modulator the received signal is in a digital form. In this example, the digital signal is split into inphase and quadrature phase components.

Figure 2B:
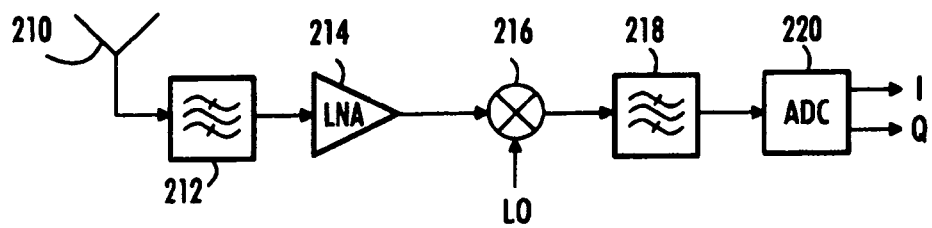

The receiver of FIG. 2A is a direct conversion receiver (also known as zero-IF receiver) where the signal at the input of the sigma delta modulator is an RF signal. FIG. 2B illustrates another example of a receiver to which embodiments of the invention can be applied. The receiver comprises an antenna 210 configured to receive radio frequency signals. The antenna 210 is connected to a filter 212 configured to filter undesired frequencies from the received signal. The filtered signal is taken to a low noise amplifier 214 configured to amplify the signal. The amplified signal is down converted to an intermediate frequency (IF) in a mixer 216 using a local oscillator signal LO. The IF signal may be filtered in a filter 218. An analog to digital converter (ADC) 220 follows the filter 218. The digital signal is split into inphase and quadrature phase components.

Figure 2C:
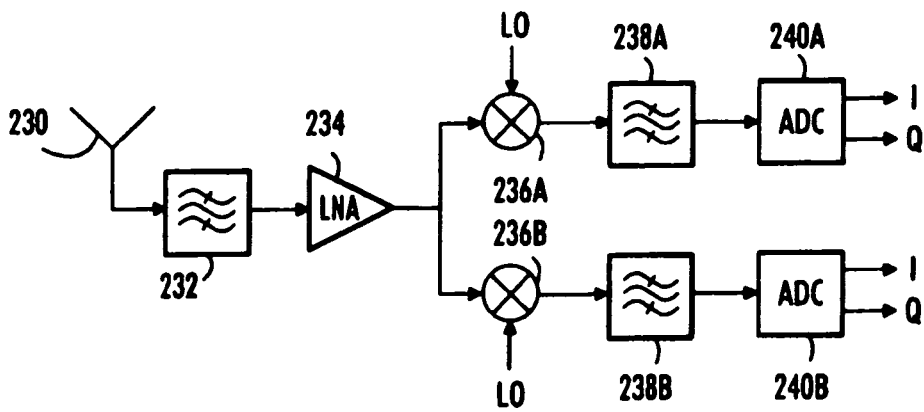

FIG. 2C illustrates yet another example of a receiver to which embodiments of the invention can be applied. The receiver comprises an antenna 230 configured to receive radio frequency signals. The antenna 230 is connected to a filter 232 configured to filter undesired frequencies from the received signal. The filtered signal is taken to a low noise amplifier 234 configured to amplify the signal. In this embodiment, the analogue signal is split into inphase and quadrature phase components after the low noise amplifier 234. Further processing of the signal is similar to the example of FIG. 2B, except that both phase components are processed separately. Thus, the receiver comprises mixers 236A, 236B, filters 238A, 238B and analog to digital converters 240A and 240B.

Embodiments of the invention may be applied to A/D converters realized with delta sigma modulators and apparatuses utilizing such A/D converters.

Figure 2D:
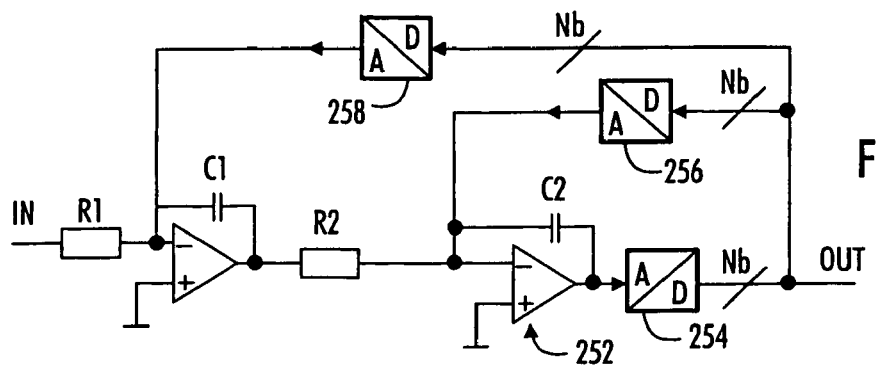
FIG. 2D illustrates an example of a delta-sigma modulator.

In general, a delta sigma modulator is an oversampling analog-to-digital converter capable of noise shaping. Delta-sigma modulators are widely used in radio receiver baseband analogue signal processing. A typical example of a second order continuous-time delta-sigma modulator is presented in FIG. 2D. The modulator comprises two integrators 250 and 252, an N-bit A/D converter 254, a first D/A converter 256 in a first feedback loop and a second D/A converter 258 in a second feedback loop. The feedback D/A converters 256, 258 are realized as multi-bit current output converters.

Figures 3A, 3B:
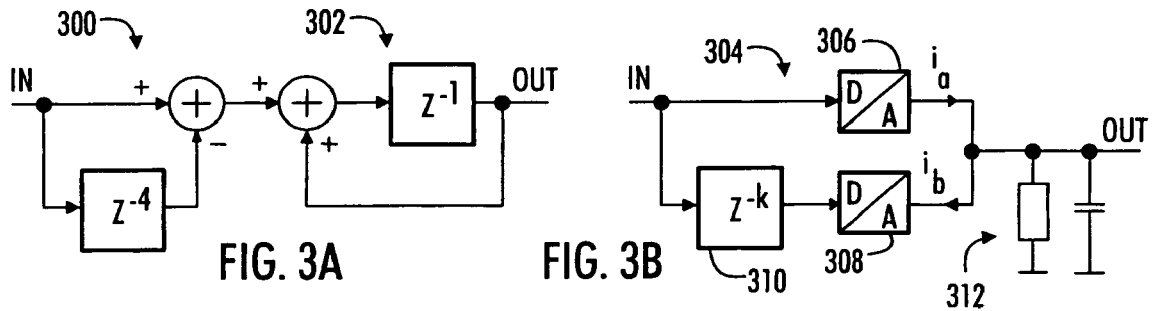
FIGS. 3A and 3B illustrate examples of a comb filter and integrator circuits.

Digital postfiltering of an A/D converter based on the delta-sigma principle is usually constructed of comb filters and integrators, as shown in FIG. 3A. The figure shows a filtering arrangement realized with a comb filter 300 and a lossless integrator 302 connected in series. The transfer function of the comb filter 300 is $1-z^{-4}$ resulting in notches at multiples of $f_s/4$, where fs is sample frequency, thus making it an ideal filter function for decimating the signal to a four times lower sampling rate. However, there is also a zero at zero frequency in the comb filter transfer function and therefore and a lossless integrator stage 302 is required to cancel out this zero resulting in a transfer function $(1-z^{-4})/(1-z^{-1})$. Normally, in a decimation filter, several cascaded filter stages are required for preventing any aliasing in decimation.

The principle described above can also be utilized for reconstruction filtering purposes in D/A converters by replacing the digital integrator with a D/A converter and an analogue integrator. However, a lossless analogue integrator is difficult to realize especially in high frequency applications. The comb filter 300 is actually a lossless derivator circuit and by replacing it with a lossy derivator circuit also the integrator can be realized as a lossy integrator i.e. a passive RC-network resulting in mixed-mode realization in FIG. 3B. The filtering arrangement of FIG. 3B comprises a comb filter 304 and an RC circuit 312. The comb filter is realized with two current-output D/A converters 306, 308 and a delay element 310. In the solution of FIG. 3B, the D/A converted signal is delayed in the delay element 310 by k samples and is subtracted from the undelayed D/A converted signal.

Figure 4:
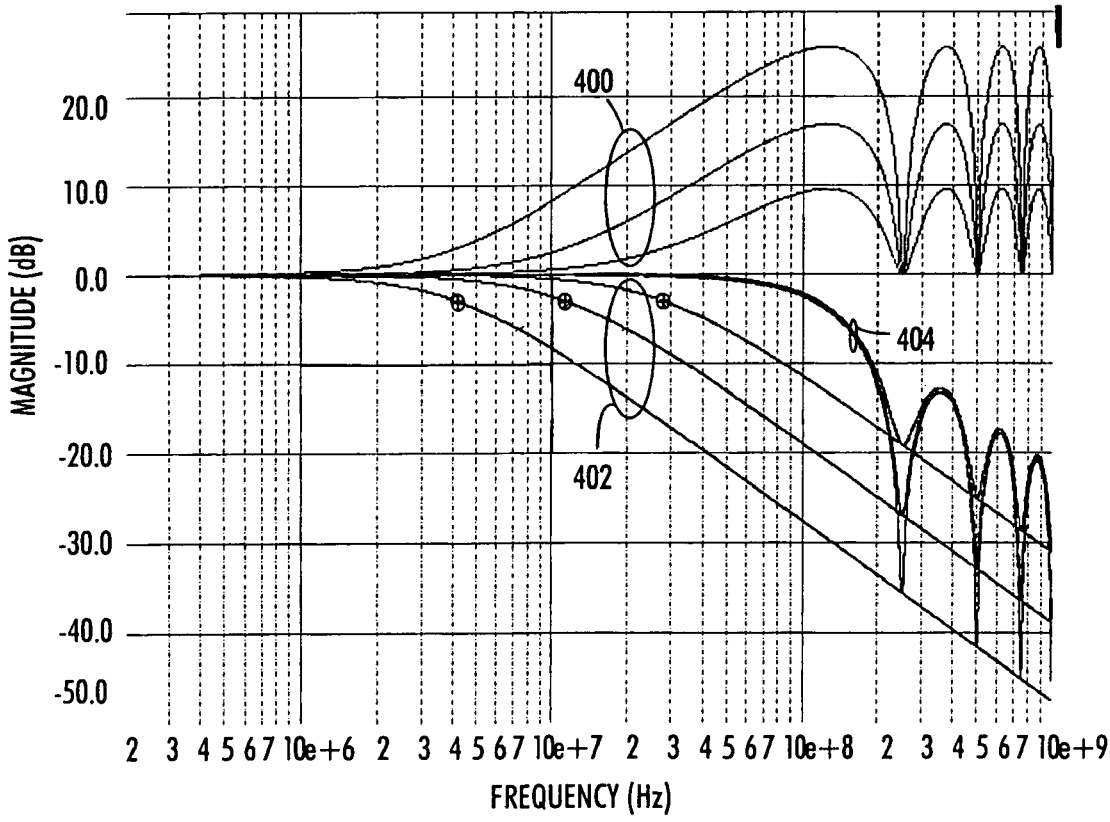
FIG. 4 shows simulated transfer functions of a comb filter.

FIG. 4 shows simulated transfer functions of the comb filter 304, the RC-circuit 312 and the total filtering arrangement of FIG. 3B. The signal sample rate is assumed to be 1 GHz, and the comb filter delay (of delay element 310) 4 ns (k=4). In addition, three sets of D/A current weights were used in the simulations. In this example, ia denotes the current of the converter 306 and ib denotes the current of the converter 308. Table 1 summarizes the currents and parameters used in the simulation.

TABLE 1

| ia | ib | RC time constant | RC-filter f-3 dB/fs | Total f-3 dB/fs |
|---|---|---|---|---|
| 2 | 1 | 5.7 ns | 0.0279 | 0.114 |
| 4 | 3 | 14 ns | 0.0113 | 0.111 |
| 10 | 9 | 38 ns | 0.00418 | 0.110 |

In FIG. 4, the x-axis shows frequency in MHz and the y-axis magnitude in dB. The curves 400 present the frequency response of the comb filter 304, the curves 402 the frequency response of the RC-filter, and the curves 404 the total frequency response of the filtering arrangement.

FIG. 4 shows that the corner frequency of the RC-filter can be placed at a significantly lower frequency than the signal bandwidth. Similarly, since the digital pre-emphasis performed by the filtering arrangement of FIG. 3B is quite moderate at low frequencies, variation in the time constant of the RC circuit does not have a drastic effect on the total frequency response. It should be noted that the RC-circuit may be replaced with another analogue filter with a suitable response.

Figure 5:
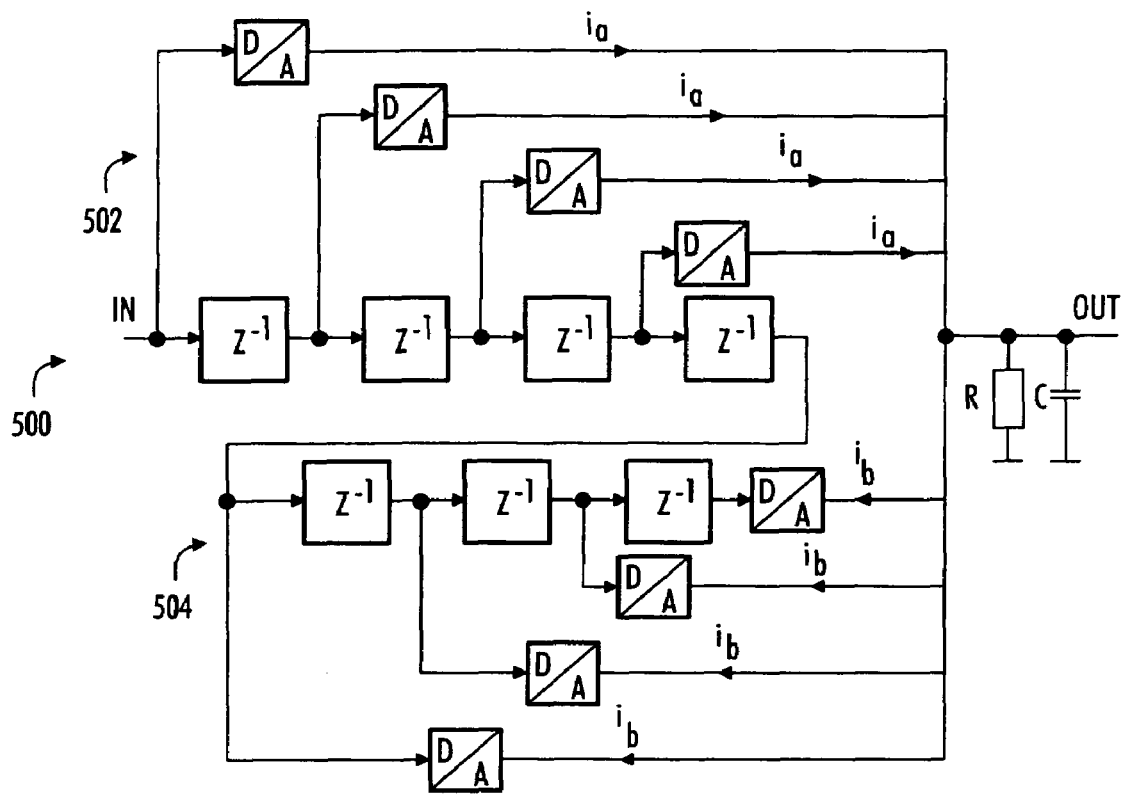
FIG. 5 illustrates a filtering arrangement of an embodiment.
Figure 6:
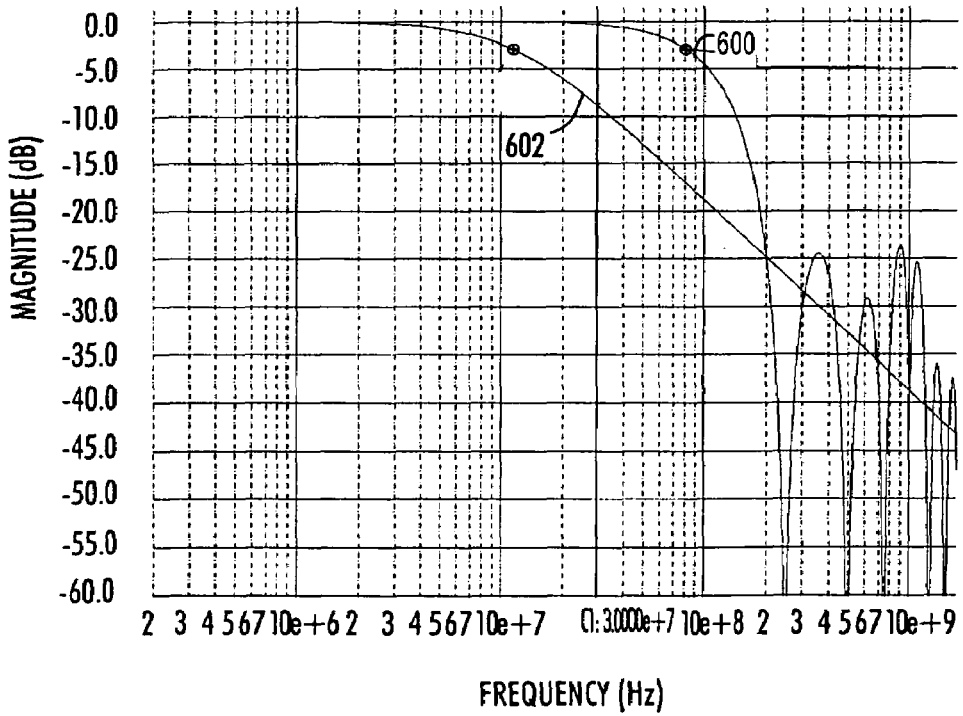
FIG. 6 shows examples of frequency responses of the arrangement of FIG. 5.

The output waveform of the filtering arrangement can be further smoothed out by adding an averaging FIR-filter to the comb filter. FIG. 5 illustrates the filtering arrangement 500 of this embodiment. In this embodiment, each D/A converter of the mixed-mode comb filter is replaced with four D/A converters constructing two four-tap averaging FIR-filters 502, 504. The first four D/A converters 502 have equal output current levels ia, and similarly the next four converters 504 have equal current levels ib. The current levels of these two groups of D/A converters are weighted the same way as the comb filter was, which results in frequency responses shown in FIG. 6. In FIG. 6, the total frequency response of the filtering arrangement 500 is denoted with 600 and the frequency response of the RC-filter is denoted with 602. In an embodiment, the four current-output D/A-converters of first four tap averaging FIR filter and the four current-output D/A- converters of second four tap averaging FIR filter have non-equal current output levels and opposite current direction.

It should be noted that the number of D/A converters in the FIR-filters is not limited to four.

As already stated, in radio receivers unwanted blocker signals have to be filtered out as much as possible and therefore a relatively complex low pass filter has to be added in front of the front end A/D converter, which may be realized with a delta-sigma modulator. When a continuous-time delta-sigma modulator is used instead of a switched capacitor delta-sigma modulator, anti-alias filtering can be relaxed since the whole integrator chain of the modulator performs low pass filtering before quantizing.

Figure 7:
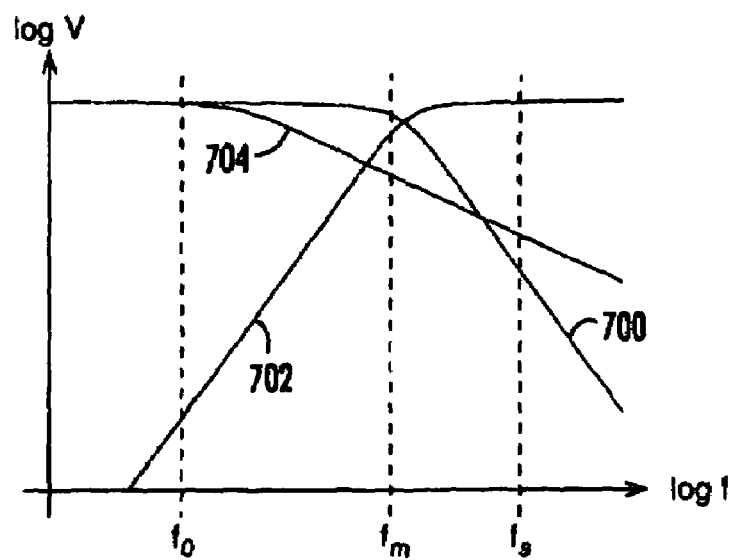
FIG. 7 illustrates signal and noise transfer functions of a typical delta sigma modulator and the embedded filter transfer function.

FIG. 7 illustrates signal and noise transfer functions of a typical delta sigma modulator. The signal transfer function 700 is a lowpass transfer function, whereas the noise transfer function 702 is a high pass function. However, there is a wide gap between the upper corner of the desired signal band (f0 in FIG. 8) and the signal transfer function corner frequency of the modulator fm so that a wide range of blocker signals can get into the modulator unattenuated, thus creating distortion or even rendering the modulator unstable. The curve 704 illustrates a typical transfer function of an RC-filter of the filtering arrangement of FIGS. 3B and 5. In the example of FIG. 7, the sampling frequency is denoted with fs.

Figure 8:
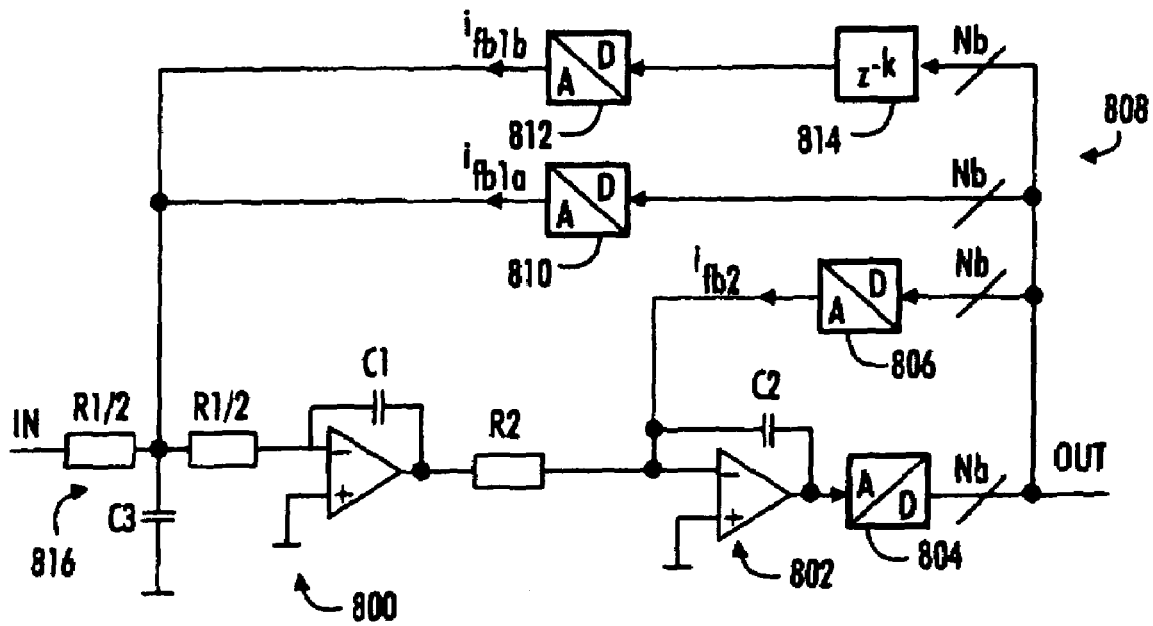
FIG. 8 illustrates an example of a second order continuous-time delta-sigma modulator utilizing a comb filter D/A converter and an embedded filter.

In an embodiment of the invention, the outer feedback D/A converter (converter 258 in FIG. 2D) of a delta sigma modulator is replaced with the mixed-mode comb filter filtering arrangement of FIG. 3B. FIG. 8 illustrates an example of an A/D converter of such an embodiment.

The modulator of FIG. 8 is a second order continuous-time delta-sigma modulator. The modulator comprises two integrators 800 and 802, an N-bit A/D converter 804, and a multi-bit current output D/A converter 806 in a first feedback loop. In the second, outer feedback loop the modulator comprises the mixed mode comb filter 808 comprising two current-output D/A converters 810, 812 and a delay element 814. In addition, an RC circuit 816 is added to the modulator input. If this embodiment is compared to the modulator of FIG. 2, it can be noticed that the resistor value at the input of the modulator is split into two equal halves, a capacitor is added and the mixed mode comb filter 808 is connected to the created node.

With moderate comb filter delay, k=2 . . . 4, the comb filter 808 and additional RC-circuit 816 do not affect the delta-sigma modulator stability. The RC-circuit added to the signal path effectively improves the anti-alias filtering capabilities of the modulator without distorting the frequency response in the desired input signal range, as depicted in FIG. 7. Similarly, the modulator is less sensitive to high frequency blocker signals, thus relaxing base band channel filter specifications.

Using this derivating D/A converter 808 in the modulator input does not increase the slew rate requirement of the operational amplifier of the first integrator 800 because of the added passive RC-circuit 816 in the input. In fact, the mixed-mode filtering function actually relaxes the slew rate requirements of the operational amplifier of the first integrator.

A minor drawback of this technique is the added current consumption of the comb filter D/A converter. For example, with comb filter coefficients 4 and −3, the current consumption of the proposed D/A converter is seven times larger compared to a prior art D/A converter and since the implementation of the passive pole at the modulator attenuates the feedback signal by 6 dB the current consumption is further doubled.

However, the D/A converters in the feedback loops normally do not dominate the current consumption of the modulator especially when the modulator order is higher than two. In an embodiment, the comb filter 808 is replaced with the averaging comb filter illustrated in FIG. 5. Adding averaging to the comb filter D/A converter merely adds the current consumption of three digital domain unit delays, i.e. three D-flip-flops in a 1-bit case. The averaging additionally relaxes requirements for modulator clock jitter and the first operational amplifier slew rate of the operational amplifier of the first integrator, which helps to save current on the system level. Furthermore, the relaxed channel filtering requirements save current and help to minimize receiver noise figure.

Figure 9:
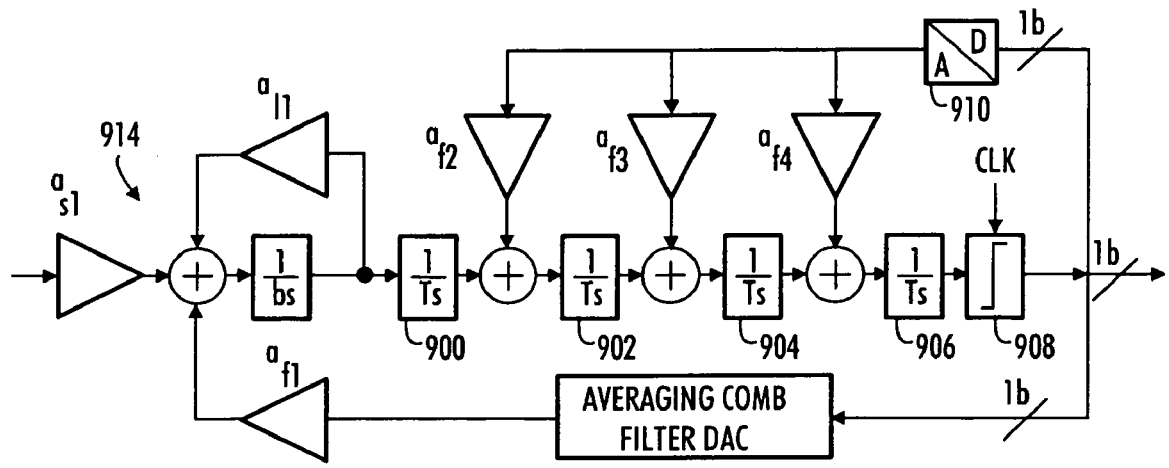
FIG. 9 illustrates another example of a delta-sigma modulator.

FIG. 9 illustrates an example of a delta sigma A/D converter where the averaging mixed-mode comb filter of FIG. 5 is used in a feedback loop as a D/A converter. The solution of FIG. 9 is a fourth-order continuous-time 1-bit delta sigma modulator. The device of FIG. 9 comprises four integrators 900, 902, 904, 906. The device further comprises a comparator 908 and a D/A converter 910 in a first feedback loop. The averaging comb filter 912 of FIG. 5 is in a second feedback loop. The device further comprises a filter arrangement 914 at the input of the device. The filter arrangement is a lossless integrator and it corresponds to the RC-circuit of earlier embodiments.

In the following example, the modulator sampling frequency is assumed to be 1 GHz and the −3 dB corner frequency of the signal transfer function is approximately 20 MHz. With averaging by four and a comb filter delay of 4 ns, the additional filter arrangement 914 (RC-filter) at the input has a −3 dB corner frequency of 11.5 MHz while the −3 dB corner frequency for the whole averaging comb filter is 81.7 MHz. Since the bandwidth of the averaging comb filter D/A converter is four times larger than the bandwidth of the modulator signal transfer function, the modulator operation is not noticeably altered especially when the rest of the D/A converters are unaltered and the feedback of the last integrator stage is most crucial for the modulator stability.

Figure 10:
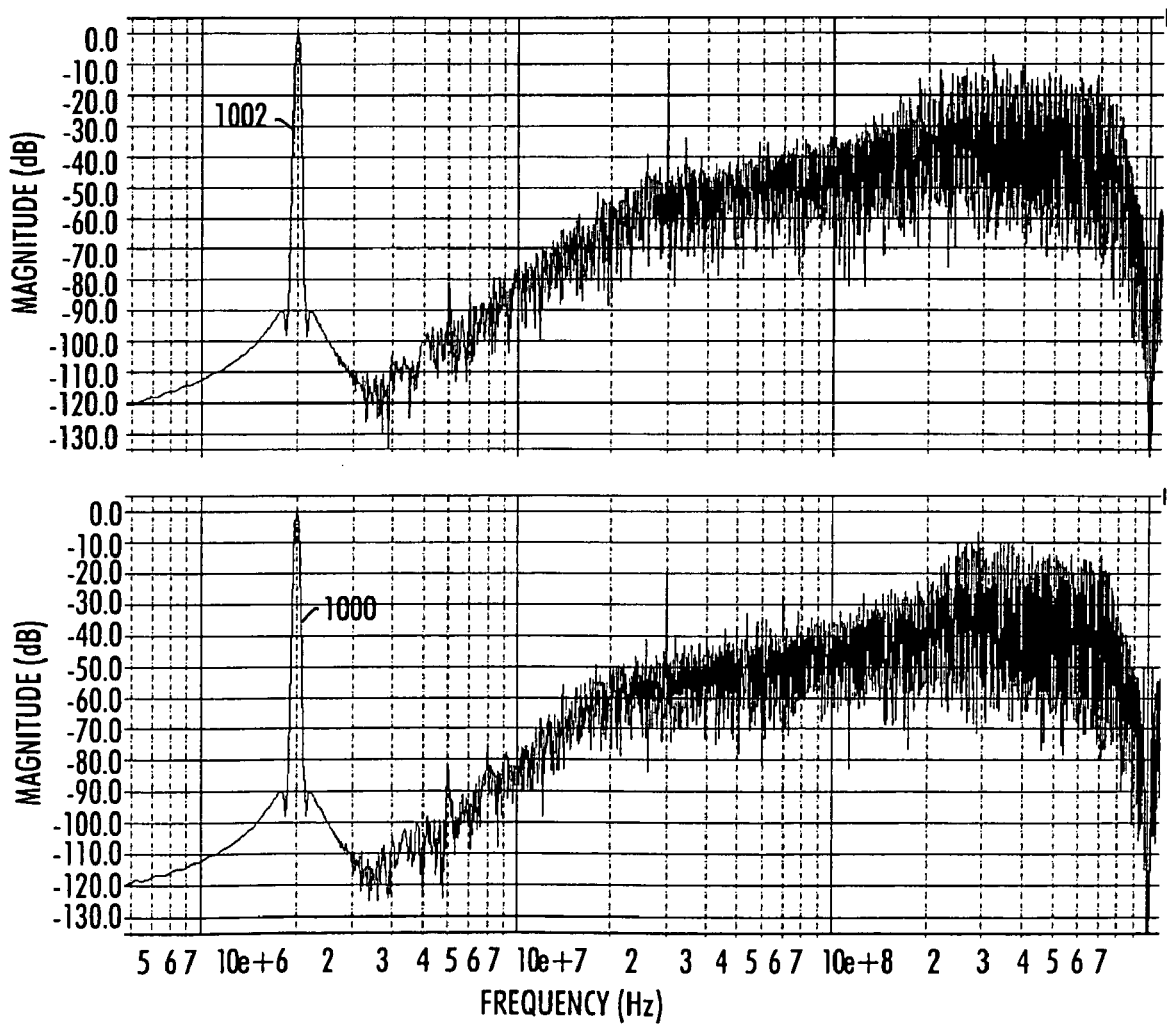
FIG. 10 shows simulated output spectrums of the modulator of FIG. 9.

FIG. 10 shows simulated output spectrums of the fourth-order modulator of FIG. 9 with 1000 and without 1002 averaging comb filter D/A converter 912. The input signals are sinusoidal 2 MHz and 30 MHz signals both with −6 dBFS amplitude for both simulations. The additional RC-filter 914 in the signal path should attenuate the 30 MHz signal by 9 dB in respect to the 2 MHz signal, and simulations clearly verify this feature.

Figure 11A:
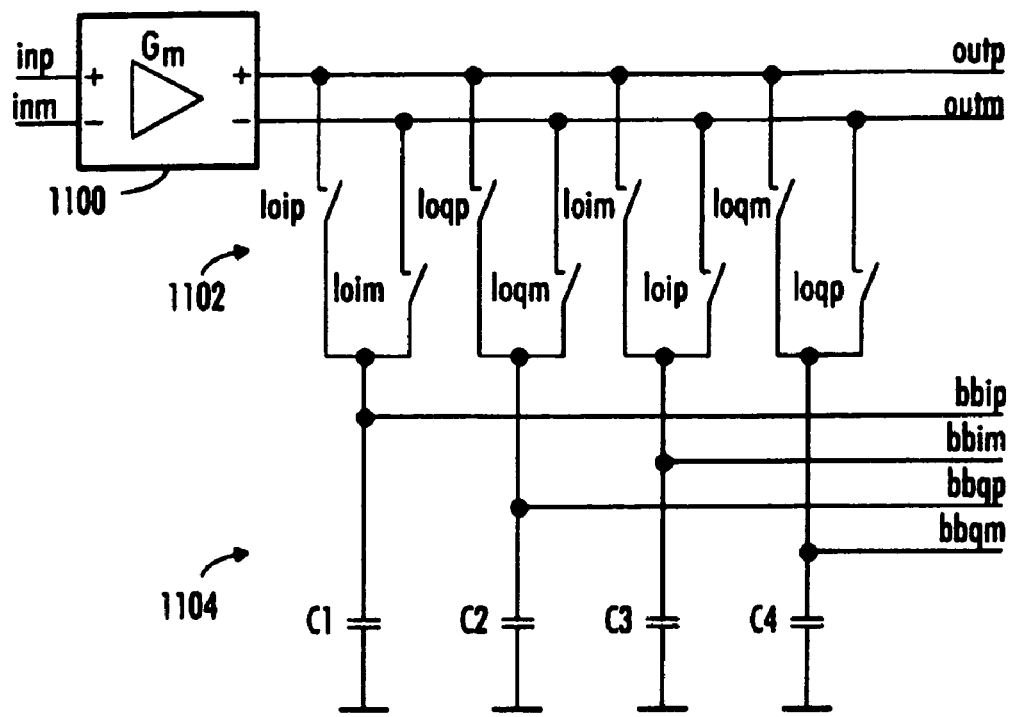
FIG. 11A illustrates an example of an impedance transferring circuit.

In an embodiment, a delta sigma A/D converter may be designed utilizing impedance transferring circuits of FIG. 11A. The impedance transferring circuit of FIG. 11A comprises a transconductance amplifier 1100, and a switching arrangement 1102 and an impedance circuit 1104 connected in series. The switching arrangement 1102 is configured to switch the impedance of the impedance circuit 1104 of the integrator from base band to the frequency of the input signal. The impedance transferring circuit further comprises a base band input and output ports between the switching arrangement and the impedance circuit.

The transconductance amplifier 1100 in FIG. 11A comprises differential inputs (inp and inm) and differential outputs (outp and outm) and has the switching arrangement 1102 and the impedance circuit 1104 as a load. The impedance transferring circuit acts as a band pass filter from the differential input (inp and inm) to the differential output (outp and outm). In addition, the impedance transferring circuit comprises four ports, bbip, bbim, bbqp and bbqm, acting both as inputs and outputs. Therefore, injecting differential inphase current signal to nodes bbip and bbim and differential quadrature current signal to nodes bbqp and bbqm the differential voltage output signal at nodes outp and outm is quadrature frequency up-converted. Moreover, this signal is integrated before up-conversion resulting in a cleaner up-converted signal. Alternatively, the voltage signal from the input inp and inm is converted into current in the transconductance amplifier and is seen as frequency down-converted and integrated inphase differential voltage signal at base band outputs bbip and bbim and quadrature differential voltage signal at base band output bbqp and bbqm.

Figure 11C:
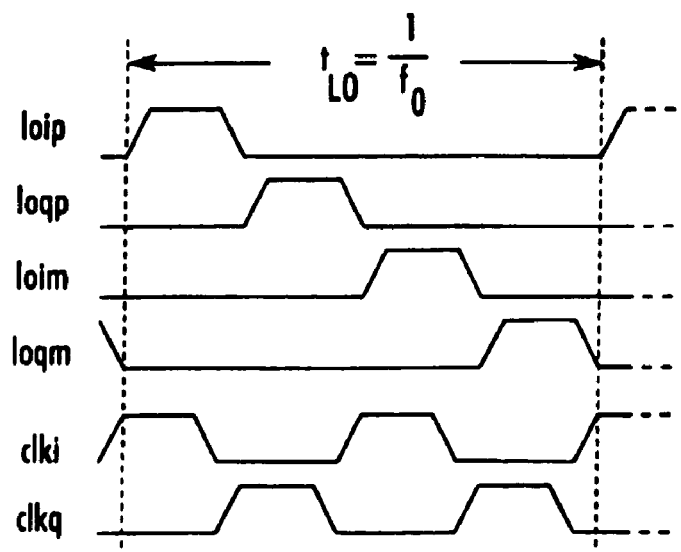
FIG. 11C illustrates the switching sequences of the switching arrangements of an impedance transferring circuit.
Figure 11B:
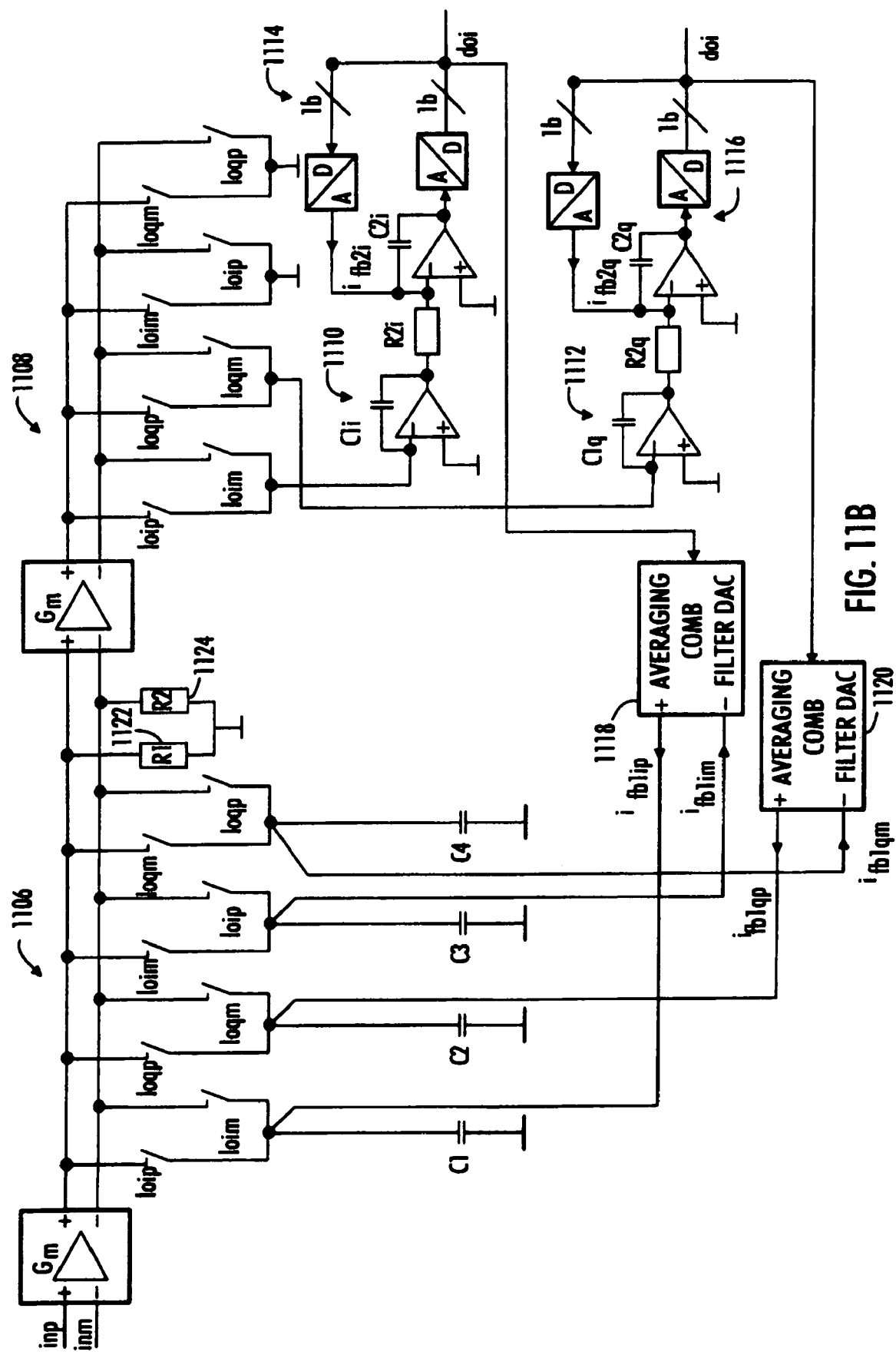
FIG. 11B illustrates an embodiment of the invention.

FIG. 11B illustrates this embodiment of the invention. FIG. 11B shows a quadrature down-converting delta-sigma modulator where two impedance transferring circuits 1106, 1108 are utilized. The circuit comprises resistors 1122 and 1124 connected in parallel with the capacitors of the first impedance transferring circuit. The device further comprises first integrators 1110 and 1112 and second integrators 1114 and 1116 for the I and Q branches, correspondingly. The device comprises two mixed-mode comb filters 1118, 1120 in feedback loops.

Referring to FIGS. 2 and 8, instead of rearranging the first integrator input by halving the input resistor, by adding a capacitor to the created node and moving the modified D/A converter output to this node, the feedback signal can first be up-converted to radio frequencies. Input signal summing and narrowband RC-filtering can be performed with the first impedance transferring circuit at radio frequencies and the signal can be down-converted back to base band frequencies into the first integrator 1110, 1112 summing node.

Thus, compared to the solution of a delta-sigma modulator in FIG. 8, two such modulators can be modified so that an input resistor and feedback D/A converters are removed from the first integrator. A modified feedback signal is fed by differential current output averaging comb filter D/A converters 1118, 1120 to capacitors C1 ... C4 of the first impedance transferring circuit 1106. The switching sequence (depicted in FIG. 11C) of the first impedance transferring circuit 1106 mixes the feedback signal up to the local oscillator frequency to the output of transconductance amplifier Gm1 of the first transferred impedance circuit 1106. The second impedance transferring circuit 1108 mixes the input signal and feedback signal from the local oscillator frequency back to base band.

The solution of FIG. 11B does not need separate RC-circuit at the input due to the performance of the first impedance transferring circuit. The impedance transferring circuit performs band pass filtering comparable to the RC-network low pass filtering in the base band.

FIG. 11C illustrates the switching sequences of the switching arrangements of the impedance transferring circuits and the clock signals, i.e. the up-converting signals loip and loim for the inphase branch in FIG. 11A and similarly the signals in the quadrature path loqp, loqm.

Figure 12:
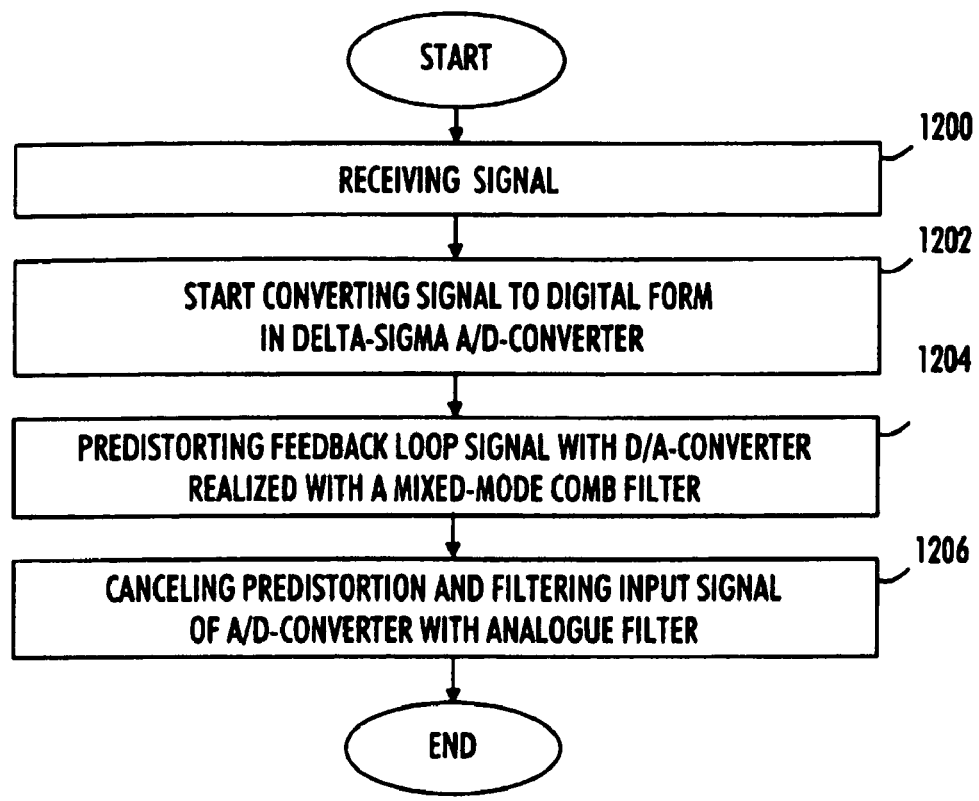
FIG. 12 is a flowchart illustrating an embodiment of the invention.

FIG. 12 is a flow chart illustrating an embodiment of the invention.

In step 1200, a delta sigma A/D converter receives an analogue signal at its input. The A/D converter comprises a feedback loop.

In step 1202, the conversion of the analogue signal to a digital form is started.

In step 1204, the signal of the feedback loop of the a delta-sigma A/D converter is predistorted with a D/A converter realized with a mixed-mode comb filter.

In step 1206, the predistortion is canceled and the input signal of the A/D converter is filtered with an analogue filter at the input of the A/D converter. In an embodiment, the analogue filter is realized with an RC-circuit. In an embodiment, the transfer functions of the mixed-mode comb filter and the analogue filter cancel each other out at frequencies below the corner frequency of the signal transfer function of the delta-sigma A/D converter.

Figure 13A:
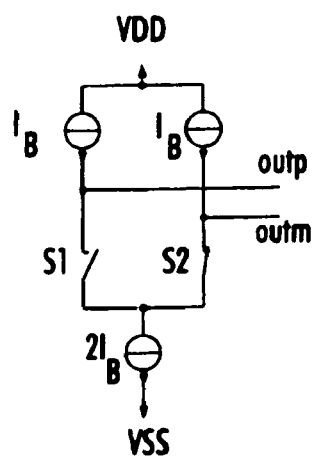
FIGS. 13A, 13B and 13C illustrate examples of D/A-converters.
Figure 13B:
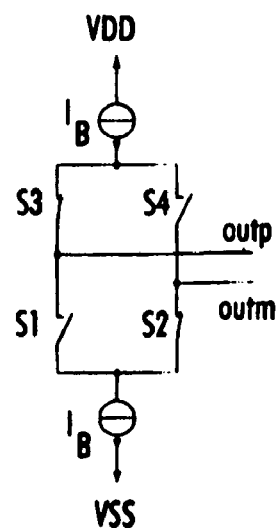
Figure 13C:
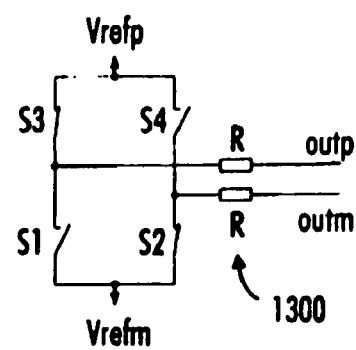

In an embodiment, the current-output D/A converters of the mixed-mode comb filter are replaced with voltage-output D/A converters. FIGS. 13A, 13B and 13C illustrate examples of possible D/A converters. FIG. 13A shows a simple differential current steering converter. FIG. 13B shoes a pus-pull differential current steering converter. FIG. 13C illustrates a differential resistive D/A converter. The voltage-output D/A converter of FIG. 13C comprises resistors 1300 which perform analogue summing. When voltage-output D/A converters are utilized in a comb filter, the output voltage of the converters are inverted. This may be performed by cross connecting differential outputs, for example. Also other methods may be used, as one skilled in the art is aware.

Even though the invention has been described above with reference to an example according to the accompanying drawings, it is clear that the invention is not restricted thereto but it can be modified in several ways within the scope of the appended claims.

The invention claimed is:

1. An apparatus, comprising:
a digital to analog converter realized with a mixed-mode comb filter connected in a feedback loop from an output of an analog to digital converter to an input of the analog to digital converter, wherein the digital to analog converter is configured to predistort a feedback signal; and
an analogue filter at the input of the analog to digital converter, wherein the analogue filter is configured to cancel the predistortion of the feedback signal.

2. The apparatus of claim 1, wherein transfer functions of the mixed-mode comb filter and the analogue filter cancel each other out at frequencies below a corner frequency of a signal transfer function of the analog to digital converter.

3. The apparatus of claim 1, wherein the mixed-mode comb filter comprises a first current-output digital to analog converter connected in parallel with a delay element and a second current-output digital to analog converter.

4. The apparatus of claim 1, wherein the mixed-mode comb filter comprises a first voltage-output digital to analog converter with analogue summing connected in parallel with a delay element and a second voltage-output digital to analog converter with opposite output polarity and analogue summing.

5. The apparatus of claim 1, wherein the mixed-mode comb filter comprises N digital to analog converters with an analogue summing connected to construct a first N tap averaging finite impulse response filter, the filter connected in parallel with a delay element and N digital to analog converters with the analogue summing connected to construct a second N tap averaging a finite impulse response filter, where N is an integer larger than one.

6. The apparatus of claim 5, wherein the N digital to analog converters of the first N tap averaging finite impulse response filter have equal current output levels and the N digital to analog converters of the second N tap averaging finite impulse response filter have equal current output levels.

7. The apparatus of claim 5, wherein the N current-output digital to analog converters of the first N tap averaging finite impulse response filter and the N current-output digital to analog converters of the second N tap averaging finite impulse response filter have nonequal current output levels and opposite current direction.

8. The apparatus of claim 1, wherein the analogue filter is a resistor-capacitor circuit.

9. A method, comprising:
predistorting a signal of a feedback loop of a delta-sigma analog to digital converter with a digital to analog converter realized with a mixed-mode comb filter; and
canceling a predistortion and filtering an input signal of the analog to digital converter with an analogue filter at an input of the analog to digital converter.

10. The method of claim 9, wherein transfer functions of the mixed-mode comb filter and the analogue filter cancel each other out at frequencies below a corner frequency of a signal transfer function of the delta-sigma analog to digital converter.

11. The method of claim 9, further comprising:
predistorting the signal of the feedback loop with a first current-output digital to analog converter connected in parallel with a delay element and a second current-output digital to analog converter.

12. The method of claim 9, further comprising:
predistorting the signal of the feedback loop with a first voltage-output digital to analog converter with analogue summing connected in parallel with a delay element and a second voltage-output digital to analog converter with opposite output polarity and analogue summing.

13. The method of claim 9, further comprising:
predistorting the signal of the feedback loop with N current-output digital to analog converters connected to construct a first N tap averaging finite impulse response filter, the filter connected in parallel with a delay element and N current-output digital to analog converters connected to construct a second N tap averaging finite impulse response filter, where N is an integer larger than one.

14. The method of claim 9, further comprising:
predistorting the signal of the feedback loop with N voltage-output digital to analog converters connected together with an analogue summing to construct a first N tap averaging finite impulse response filter, the filter connected in parallel with a delay element and N voltage-output digital to analog converters with opposite output polarity connected together with the analogue summing to construct a second N tap averaging finite impulse response filter, where N is an integer larger than one.

15. An apparatus, comprising:
a first circuitry and a second circuitry connected in series, wherein
the first circuitry comprises a transconductance amplifier, and a switching circuitry and an impedance circuit connected in series, wherein an input to the first circuitry is an analog signal, and
the second circuitry comprising a transconductance amplifier, and a switching circuitry connected in series, wherein an input to the second circuitry is an output signal of the transconductance amplifier of the first circuitry;
two delta-sigma analog to digital converters comprising at least two integrator stages, connected to the switching circuitry of the second circuitry; and
two feedback mixed-mode digital to analog converters, whose inputs are connected to an output of the delta-sigma analog to digital converters and an output between the switching circuitry and the impedance circuit of the first circuitry, wherein
the switching circuitry of the first circuitry is configured to switch the impedance of the impedance circuit of the first circuitry from base band to a local oscillator frequency,
the second circuitry is configured to perform quadrature down-mixing from the local oscillator frequency to the base band, and
the switching circuitry and the impedance circuit of the first circuitry are configured to up-convert a signal from the two feedback mixed-mode digital to analog converters to the local oscillator frequency.

16. An apparatus, comprising:
digital to analog converting means realized with a mixed-mode comb filter connected in a feedback loop from an output of an analog to digital converting means to an input of the analog to digital converting means, the digital to analog converting means for predistorting a feedback signal; and
analogue filtering means at the input of the analog to digital converting means, the analogue filtering means for canceling the predistortion of the feedback signal.

17. An apparatus, comprising:
first circuitry means and second circuitry means connected in series, wherein
the first circuitry means comprises a transconductance amplifier, and a switching means and an impedance means connected in series, wherein an input to the first circuitry means is an analog signal, and
the second circuitry means comprising a transconductance amplifying means, and a switching means connected in series, wherein an input to the second circuitry means is an output signal of the transconductance amplifying means of the first circuitry means;
two delta-sigma analog to digital converting means comprising at least two integrator stages, connected to the switching means of the second circuitry means; and
two feedback mixed-mode digital to analog converting means, whose inputs are connected to an output of the delta-sigma analog to digital converting means and an output between the switching means and the impedance means of the first circuitry means,
the switching means of the first circuitry means for switching the impedance of the impedance circuit of the first circuitry means from base band to a local oscillator frequency,
the second circuitry means for performing quadrature down-mixing from the local oscillator frequency to the base band, and
the switching means and the impedance means of the first circuitry means for up-converting a signal from the two feedback mixed-mode digital to analog converting means to the local oscillator frequency.

\* \* \* \* \*